United States Patent
Wang et al.

(10) Patent No.: US 10,711,324 B2
(45) Date of Patent: Jul. 14, 2020

(54) METHOD FOR REMOVING RADIOACTIVE ELEMENT THORIUM IN RARE EARTH MINERAL

(71) Applicant: SOOCHOW UNIVERSITY, Suzhou (CN)

(72) Inventors: Shuao Wang, Suzhou (CN); Huangjie Lu, Suzhou (CN); Yaxing Wang, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 0 days.

(21) Appl. No.: 16/300,565

(22) PCT Filed: Jul. 5, 2017

(86) PCT No.: PCT/CN2017/091765
§ 371 (c)(1),
(2) Date: Nov. 10, 2018

(87) PCT Pub. No.: WO2018/227674
PCT Pub. Date: Dec. 20, 2018

(65) Prior Publication Data
US 2019/0144968 A1    May 16, 2019

(30) Foreign Application Priority Data
Jun. 16, 2017 (CN) .......................... 2017 1 0456615

(51) Int. Cl.
*C22B 60/02* (2006.01)
*C22B 3/44* (2006.01)
(Continued)

(52) U.S. Cl.
CPC .............. *C22B 3/44* (2013.01); *C01B 19/004* (2013.01); *C01B 19/008* (2013.01); *C22B 59/00* (2013.01);
(Continued)

(58) Field of Classification Search
CPC ........ C22B 60/0291; C22B 59/00; C30B 7/00
See application file for complete search history.

(56) References Cited

U.S. PATENT DOCUMENTS 3,511,597 A      5/1970  Olson et al.
2016/0348214 A1  12/2016 Reynier et al.

FOREIGN PATENT DOCUMENTS

CN    101294244 A    10/2008
CN    101886175 A    11/2010
(Continued)

*Primary Examiner* — Melissa S Swain
(74) *Attorney, Agent, or Firm* — SZDC Law P.C.

(57) ABSTRACT

The present invention relates to a method for removing radioactive element thorium in a rare earth mineral, comprising: mixing the rare earth mineral with selenium dioxide in water, reacting radioactive element thorium with selenium dioxide by hydrothermal method, cooling to form a crystal, and separating the crystal to remove the radioactive element thorium. In the invention, tetravalent element thorium is selectively bound to inorganic ligand selenium dioxide in a hydrothermal environment to form a crystal, thereby achieving removal of radioactive element thorium. The method has high crystallization rate and high decontamination efficiency, and removes thorium from trivalent lanthanide element by crystallization solidification under a uniform reaction condition. Compared to a conventional industrial method for thorium separation, the method has low energy consumption and high separation ratio, enables one-step solidification separation, and effectively avoids the disadvantages of redundant separation operations and a large amount of organic and radioactive liquid wastes.

8 Claims, 5 Drawing Sheets

(51) Int. Cl.
   *C30B 7/14*   (2006.01)
   *C01B 19/00*  (2006.01)
   *C22B 59/00*  (2006.01)
   *C30B 29/10*  (2006.01)
   *C30B 29/46*  (2006.01)
   *C30B 7/10*   (2006.01)

(52) U.S. Cl.
   CPC ............ *C22B 60/0291* (2013.01); *C30B 7/10* (2013.01); *C30B 7/14* (2013.01); *C30B 29/10* (2013.01); *C30B 29/46* (2013.01); *C01P 2002/72* (2013.01); *C01P 2004/10* (2013.01)

(56) References Cited

FOREIGN PATENT DOCUMENTS

| | | |
|---|---|---|
| CN | 104498739 A | 4/2015 |
| JP | 2015057507 A | 3/2015 |

METHOD FOR REMOVING RADIOACTIVE ELEMENT THORIUM IN RARE EARTH MINERAL

This application is the National Stage Application of PCT/CN2017/091765, filed on Jul. 5, 2017, which claims priority to Chinese Patent Application No. 201710456615.9, filed on Jun. 16, 2017, which is incorporated by reference for all purposes as if fully set forth herein.

FIELD OF THE INVENTION

The present invention relates to separation of elements, and more particularly to a method for removing radioactive element thorium from a rare earth mineral.

DESCRIPTION OF THE RELATED ART

Rare earth elements are an important strategic resource, and have their irreplaceable application values in various industries. With development of economy and technology, there is an increasing demand for rare earth products worldwide. However, three primary rare earth minerals currently known all are accompanied with radioactive thorium (Th) and uranium (U), and thus removal of radioactive contaminants is particularly important during production of rare earths. A rare earth ore (monazite) having the second largest reserve in China has a very high content of thorium with a mass percent of up to 20%, and the presence of radioactive thorium seriously inhibits the industrial mining/refining process of rare earths.

Current industrial treatment means are that: a monazite concentrate is decomposed in the presence of a base, and useful rare earths are extracted from a feed liquid, leaving solid residues such as $ThO_2$, U and REO, thereby achieving separation of radioactive elements from rare earth elements. The process utilizes a strongly basic liquid and results in high requirements for anti-corrosion capacity of devices, accumulation of a large amount of radioactive thorium in the refining process causes high radiation-shielding requirements for operations and devices, and a large amount of liquid wastes causes serious environmental problems. In addition, the method cannot completely purify rare earths, and further purification and separation are required for separation of rare earths and thorium.

Thorium is generally in a tetravalent state, and slightly different from trivalent lanthanide element in ionic radius and extractant complexing ability. Currently, a widely used separation process is solvent extraction method. The method utilizes a difference in complexing with an organic ligand between a high valence element and a low valence element to establish a multi-stage extraction system for removing tetravalent element Th from an aqueous solution of the mineral after treatment. Even if the multi-stage extraction system has achieved industrial mass production, treatment on a radioactive liquid waste after the extraction (e.g., disposal and storage of an organic liquid waste) is very problematic, the organic liquid waste from the solvent extraction causes severe environmental pollution, and the cost is relatively high.

In addition, some methods having strong purification ability such as electrochemical method, ion exchange, chromatographic separation are also used for separation of tetravalent thorium and rare earth elements. However, these methods have disadvantages such as small treatment scale, complex treatment process as well as equipment redundancy.

SUMMARY OF THE INVENTION

To solve the forgoing technical problems, an object of the present invention is to provide a method for removing radioactive element thorium from a rare earth mineral. The method is inexpensive, environmentally-friendly and highly efficient, and can remove thorium from rare earth elements by crystallization and solidification under a uniform reaction condition.

For the above purpose, the present invention provides a method for removing radioactive element thorium in a rare earth mineral, comprising the following steps: mixing the rare earth mineral with selenium dioxide ($SeO_2$) in water, reacting radioactive element thorium (Th) in the rare earth mineral with selenium dioxide by a hydrothermal method to generate $Th(SeO_3)_2$, cooling the resulting solution to form a crystal, and separating the crystal to remove the radioactive element thorium.

In a specific embodiment, the rare earth mineral comprises a lanthanide element and/or actinide element. The lanthanide element and/or actinide element is in a trivalent state or tetravalent state. The purpose of removal of element thorium can also be achieved by the above method when the rare earth mineral is replaced by a binary, ternary, or multi-component lanthanide-actinide composition.

Preferably, a molar ratio of the lanthanide element and/or actinide element to selenium dioxide is 1: 2-10. The excess of selenium dioxide can adjust the size of a separation factor and increase the crystallization rate of tetravalent Th.

Preferably, the condition of the hydrothermal method is that the reaction is performed at 200-230° C. for 1-3 days. The hydrothermal method is performed in a sealed condition.

More preferably, the resulting solution is cooled to room temperature after the reaction is completed. The room temperature generally is 10-40° C., preferably, 20-30° C.

More preferably, the cooling rate is 4-10° C./h.

Preferably, a step of washing the crystal is also included after separating the crystal. After the crystal is washed, a trivalent rare earth element is contained in the washing solution. By means of the forgoing method, a crystal of a tetravalent structure type is selectively generated, and the separation of lanthanide and actinide elements in different valences can be achieved by separating the crystal of the same structure and the crystal washing solution.

Preferably, the crystal is washed sequentially with water, alcohol and dilute nitric acid. The alcohol is ethanol. Selenious acid will be generated from selenium dioxide in water, and the generated selenious acid can be removed by washing.

Selenious acid is an inorganic salt ligand required for generating a crystal, and is soluble in water. Thus, an excess of selenious acid can be removed by washing.

More preferably, the dilute nitric acid has a mass concentration of 5-10%.

Preferably, the crystal is a needle-like and flocculent crystal.

In the invention, the starting reactants are simultaneously added into a reaction container, sealed, and heated at a high temperature. After the reaction is completed, the solution and crystals are taken out and separated. Then, the crystals are washed and dissolved, and a solution phase and a crystal phase are separated, thereby achieving the purpose of removal of element thorium in the rare earth mineral.

Preferably, element cerium in the rare earth mineral can also be removed by the forgoing method.

FIG. 9 is a schematic diagram of the separation principle of the present invention. The reaction is performed by the hydrothermal method, and tetravalent element thorium is selectively bound in a hydrothermal environment by using selenium dioxide as inorganic ligand to form a crystal, thereby achieving separation of radioactive thorium from other rare earth elements. If element cerium is present in the rare earth mineral, during the hydrothermal reaction, trivalent element cerium also can be oxidized into tetravalent cerium by selenium dioxide, and the tetravalent cerium forms a solid solution of the same structure as tetravalent thorium, achieving separation of tetravalent actinide element and trivalent lanthanide element.

In the invention, the reaction equations of the lanthanide element or actinide element and $SeO_2$ are as follows:

$$Ln(NO_3)_3 \cdot 6H_2O + SeO_2 \rightarrow Ln_2(SeO_3)_3$$

(Ln=La)

$$Ln(NO_3)_3 \cdot 6H_2O + SeO_2 \rightarrow Ln(SeO_3)_2$$

(Ln=Ce)

$$Ln(NO_3)_3 \cdot 6H_2O + SeO_2 \rightarrow H_7Ln_{11}(SeO_3)_{18}(SeO_4)_2$$

(Ln=Pr,Nd,Sm)

$$Ln(NO_3)_3 \cdot 6H_2O + SeO_2 \rightarrow Ln_3(SeO_3)_3(OH)$$

(Ln=Eu)

$$Ln(NO_3)_3 \cdot 6H_2O + SeO_2 \rightarrow Ln_2(SeO_4)(SeO_3)_2(H_2O)_2$$

(Ln=Pr,Nd,Sm,Eu,Gd,

Tb,Dy,Ho,Er,Tm,Yb,Lu)

$$An(NO_3)_4 \cdot 6H_2O + SeO_2 \rightarrow An(SeO_3)_2$$

(An=Th)

The above reactions are carried out under the same conditions. Ln represents a lanthanide element and An represents an actinide element. It can be seen from the above reaction equations that tetravalent element Ce will react with selenium dioxide to generate $Ce(SeO_3)_2$, and likewise, element Th generates a crystal of the same structure type, and the remaining lanthanide elements are still in a trivalent state in the crystal generated by the reaction.

Where a single lanthanide element is present in the reaction system, the elements can react with selenium dioxide to form crystals (FIG. 1). In the FIG. 1, $Ln_2(SeO_3)_3$ is a transparent sheet crystal, $Ln(SeO_3)_2$ is an orange rod-like crystal, $H_7Ln_{11}(SeO_3)_{18}(SeO_4)_2$ is a square sheet crystal, $Ln_3(SeO_3)_4(OH)$ is a transparent thick rod-like crystal, and $Ln_2(SeO_4)(SeO_3)_2(H_2O)_2$ is a bulk crystal. In the forgoing formulas, Ln represents a lanthanide element.

However, where multiple lanthanide elements or actinide elements are contained in the reaction system, if element cerium or element thorium is also present in the system, when selenium dioxide is added, element cerium or element thorium will preferentially react with selenium dioxide to form crystals, other elements will not react with selenium dioxide in the presence of element cerium or element thorium, and the remaining trivalent lanthanide element ions are not converted into crystals and are only present in the solution phase. The mixture system containing various lanthanide elements and element thorium only generates a crystal structure of tetravalent cerium and tetravalent thorium under the same reaction conditions.

Therefore, trivalent and tetravalent elements only generate a tetravalent crystal structure in such a system, and trivalent metal ions do not form a solid solution simultaneously to tetravalent metal ions.

By means of the above technical solutions, the present invention has the following advantages:

(1) the present invention provides a fully new separation method proposed based on selective crystallization;

(2) the separation process of the present invention uses a mild hydrothermal synthesis to separate lanthanide and actinide elements, and represents an environmentally-friendly, highly efficient and inexpensive method;

(3) the present invention has a high selective crystallization rate for tetravalent thorium and a high separation ratio for trivalent and tetravalent elements, and can realize in one step the purpose of solidification of tetravalent thorium in a crystal; this purification manner avoids multiple separations due to a low separation ratio, and avoids the problem of generation of a large amount of organic and radioactive liquid wastes;

(4) the reagents for post-treatment of the present invention are inexpensive and easily available; for example, the resulting crystal is washed with deionized water, ethanol, and 5-10% dilute nitric acid to remove an unreacted trivalent rare earth salt and an excess of selenious acid; and (5) the method of the present invention, in a binary, ternary, or multi-component lanthanide-actinide fractional crystallization experiment, tends to form a crystal of a tetravalent structure, and trivalent crystals all accumulate in the solution; compared to a conventional separation of fractional crystallization, the removal rate of thorium by solidification in the solution in the invention is close to 100%, and thus the highly efficient separation of a radioactive element can be realized by solidification.

DETAILED DESCRIPTION OF THE PREFERRED EMBODIMENTS

The invention will be further illustrated in more detail with reference to the accompanying drawings and embodiments. It is noted that, the following embodiments only are intended for purposes of illustration, but are not intended to limit the scope of the present invention.

Embodiment 1

Separation of Binary Lanthanide and Actinide Elements

In this example, crystals of rare earth elements (Th$(NO_3)_4 \cdot 6H_2O$ and La$(NO_3)_3 \cdot 6H_2O$) were substituted for a rare earth mineral, to verify the effect of a method for removing radioactive element thorium in a rare earth mineral of the present invention.

0.1 mmol Th$(NO_3)_4 \cdot 6H_2O$ solid, 0.1 mmol La$(NO_3)_3 \cdot 6H_2O$ solid, and 0.2 mmol SeO$_2$ were placed in a 10 mL polytetrafluoroethylene reaction vessel, and 2 mL deionized water was added. The resulting mixture was sealed, heated up to a temperature of 230° C. and heated for 3 days, and then cooled at a rate of 8.3° C./h to room temperature (20-30° C.) to give a crystal product. The crystal product was washed with deionized water and the washing solution was collected in a 10 mL centrifuge tube and diluted to volume. The resulting crystal product was washed with ethanol and 5-10% dilute nitric acid, and then allowed to dry at room temperature.

Following the forgoing method, the amount of SeO$_2$ was adjusted to 0.4 mmol, 0.6 mmol, 0.8 mmol and 1.0 mmol respectively, other conditions were kept unchanged, and the same reaction was performed to give crystal products.

Figure 1:
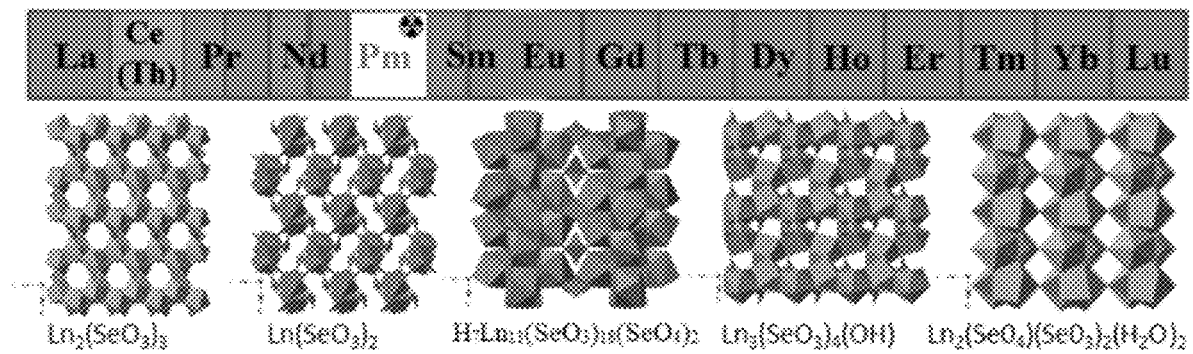
FIG. 1 is a schematic diagram of crystals generated in the method of the present invention.
Figure 2:
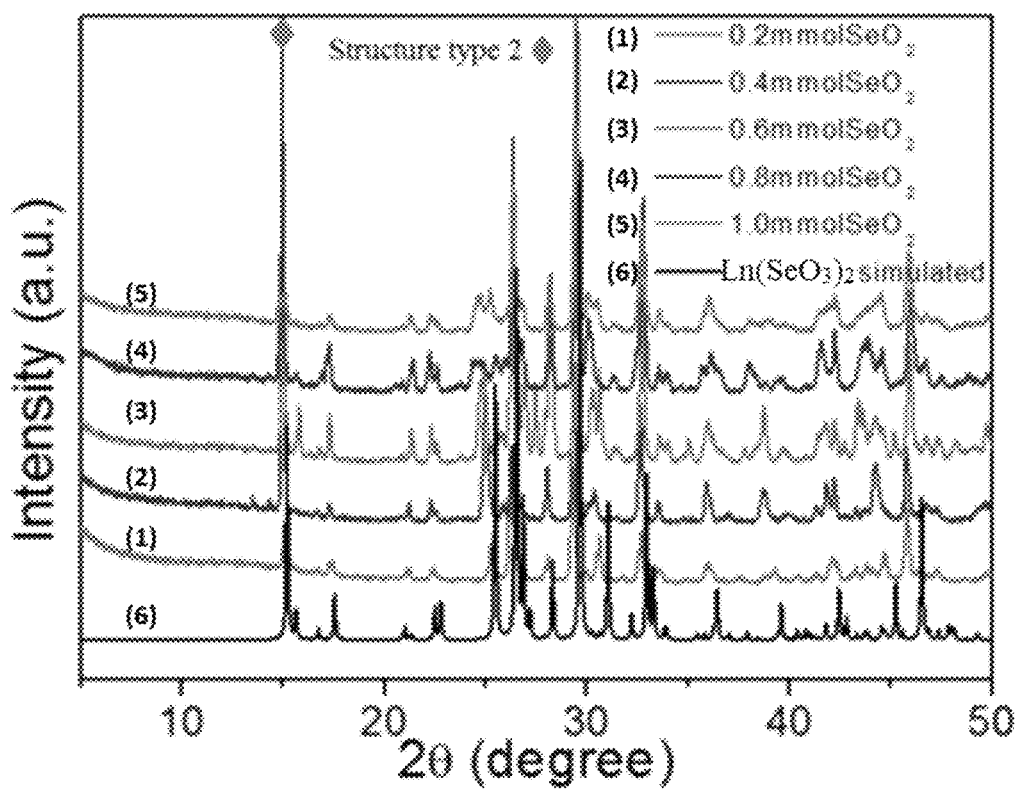
FIG. 2 is a powder diffraction pattern of the resulting crystals according to embodiment 1 of the present invention.

The generated crystals were characterized by a powder diffractometer, as shown in FIG. 2. In the FIG. 2, a curve (6) is a spectrum of a powder structure simulated by software for a single tested crystal structure (in the FIG. 2, "Ln(SeO$_3$)$_2$ simulated" represents the simulation results of Ce(SeO$_3$)$_2$ crystal, and "Structure type2" indicates one of the most important characteristic peaks of each curve. FIGS. 3-8 are similar to this figure). Curves 1-5 are powder diffraction spectra measured for crystals actually obtained after the reaction with different concentrations of SeO$_2$. In the figures, their main characteristic peaks are the same, namely, peaks of each curve are the same as those of the structure type of Ce(SeO$_3$)$_2$ crystal, and this indicates that they have the crystal type of the same structure.

The crystal was dissolved in concentrated nitric acid and then diluted to a low acid concentration. The concentration of each element was determined by ICP-Ms and ICP-OES. The concentration of each element in the washing solution was similarly determined by ICP-Ms and ICP-OES, and then a separation factor and a yield were calculated. The results are shown in Table 1.

TABLE 1

Separation factor and yield

| Molar ratio | Crystal $R_{Th/La}$ | Washing solution $R_{Th/La}$ | Separation factor | Recovery rate (Th) |
|---|---|---|---|---|
| Sample 1 | 78.2 | 0.017 | 4656.9 | 98.95% |
| Sample 2 | 17.4 | 8.7E−5 | 200837.0 | ~100% |
| Sample 3 | 8.91 | 8.7E−5 | 101993.2 | ~100% |
| Sample 4 | 6.67 | 9.7E−5 | 69168.5 | ~100% |
| Sample 5 | 10.2 | 8.2E−5 | 123933.7 | ~100% |

In table 1, samples 1-5 represent the products for SeO$_2$ in an amount of 0.2 mmol, 0.4 mmol, 0.6 mmol, 0.8 mmol and 1.0 mmol respectively. The recovery rate is a recovery rate of Th.

Embodiment 2

Separation of Binary Lanthanide and Actinide Elements

In this example, crystals of rare earth elements (Th$(NO_3)_4 \cdot 6H_2O$ and Eu$(NO_3)_3 \cdot 6H_2O$) were substituted for a rare earth mineral, to verify the effect of a method for removing radioactive element thorium in a rare earth mineral of the present invention.

0.1 mmol Th$(NO_3)_4 \cdot 6H_2O$ solid, 0.1 mmol Eu$(NO_3)_3 \cdot 6H_2O$ solid, and 0.2 mmol SeO$_2$ were placed in a 10 mL polytetrafluoroethylene reaction vessel, and 2 mL deionized water was added. The resulting mixture was sealed, heated up to a temperature of 230° C. and heated for 3 days, and then cooled at a rate of 8.3° C./h to room temperature (20-30° C.) to give a crystal product. The crystal product was washed with deionized water and a washing solution was collected in a 10 mL centrifuge tube and diluted to volume. The resulting crystal product was washed with ethanol and 5-10% dilute nitric acid, and then allowed to dry at room temperature.

Following the forgoing method, the amount of SeO$_2$ was adjusted to 0.4 mmol, 0.6 mmol, 0.8 mmol and 1.0 mmol respectively, other conditions were kept unchanged, and the same reaction was performed, to give crystal products.

Figure 3:
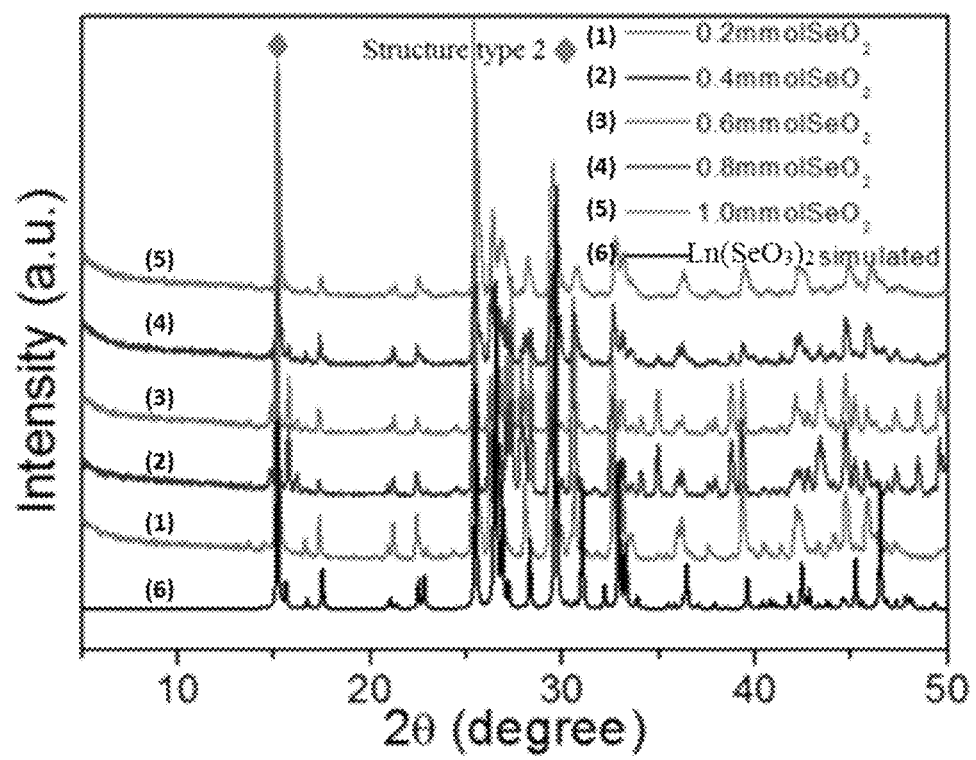
FIG. 3 is a powder diffraction pattern of the resulting crystals according to embodiment 2 of the present invention.

The generated crystals were characterized by a powder diffractometer, as shown in FIG. 3. It is shown that the doping reaction generates only one structure type of crystals. The crystals have the same structure as that of Ce(SeO$_3$)$_2$ crystal. The crystal was dissolved in concentrated nitric acid and then diluted to a low acid concentration. The concentration of each element was determined by ICP-Ms and ICP-OES. The concentration of each element in the washing solution was similarly determined by ICP-Ms and ICP-OES, and then a separation factor and a yield were calculated. The results are shown in Table 2.

TABLE 2

Separation factor and yield

| Molar ratio | Crystal $R_{Th/Eu}$ | Washing solution $R_{Th/Eu}$ | Separation factor | Recovery rate (Th) |
|---|---|---|---|---|
| Sample 1 | 70.1 | 0.074 | 949.4 | 95.53% |
| Sample 2 | 6.04 | 3.4E−4 | 17559.6 | 99.98% |
| Sample 3 | 4.68 | 3.5E−4 | 13530.3 | 99.98% |
| Sample 4 | 4.18 | 3.2E−4 | 13112.2 | 99.99% |
| Sample 5 | 2.69 | 3.8E−4 | 7028.5 | 99.99% |

In table 2, samples 1-5 represent the products for SeO$_2$ in an amount of 0.2 mmol, 0.4 mmol, 0.6 mmol, 0.8 mmol and 1.0 mmol respectively.

Embodiment 3

Separation of Binary Lanthanide and Actinide Elements

In this example, crystals of rare earth elements (Th$(NO_3)_4 \cdot 6H_2O$ and Yb$(NO_3)_3 \cdot 6H_2O$) were substituted for a rare earth mineral, to verify the effect of a method for removing radioactive element thorium in a rare earth mineral of the present invention.

0.1 mmol Th$(NO_3)_4 \cdot 6H_2O$ solid, 0.1 mmol Yb$(NO_3)_3 \cdot 6H_2O$ solid, and 0.2 mmol SeO$_2$ were placed in a 10 mL polytetrafluoroethylene reaction vessel, and 2 mL deionized water was added. The resulting mixture was sealed, heated up to a temperature of 230° C. and heated for 3 days, and then cooled at a rate of 8.3° C./h to room temperature (20-30° C.) to give a crystal product. The crystal product was washed with deionized water and a washing solution was collected in a 10 mL centrifuge tube and diluted to volume. The resulting crystal product was washed with ethanol and 5-10% dilute nitric acid, and then allowed to dry at room temperature.

Following the forgoing method, the amount of $SeO_2$ was adjusted to 0.4 mmol, 0.6 mmol, 0.8 mmol and 1.0 mmol respectively, other conditions were kept unchanged, and the same reaction was performed, to give crystal products.

Figure 4:
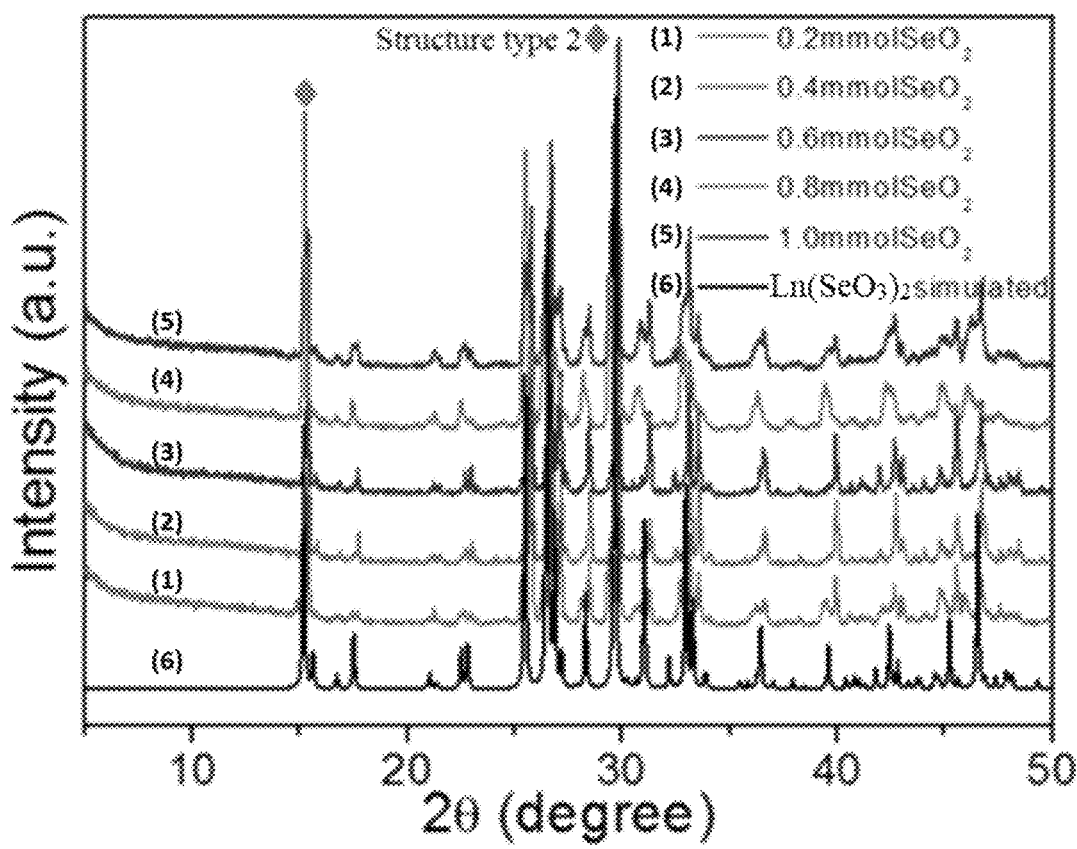
FIG. 4 is a powder diffraction pattern of the resulting crystals according to embodiment 3 of the present invention.

The generated crystals were characterized by a powder diffractometer, as shown in FIG. 4. It is shown from FIG. 4 that the doping reaction generates only one structure type of crystals. The crystals have the same structure as that of $Ce(SeO_3)_2$ crystal. The crystal was dissolved in concentrated nitric acid and then diluted to a low acid concentration. The concentration of each element was determined by ICP-Ms and ICP-OES. The concentration of each element in the washing solution was similarly determined by ICP-Ms and ICP-OES, and then a separation factor and a yield were calculated. The results are shown in Table 3.

TABLE 3

Separation factor and yield

| Molar ratio | Crystal $R_{Th/Yb}$ | Washing solution $R_{Th/Yb}$ | Separation factor | Recovery rate (Th) |
|---|---|---|---|---|
| Sample 1 | 76.1 | 0.025 | 3038.9 | 98.13% |
| Sample 2 | 9.08 | 9.6E−5 | 94135.3 | 99.99% |
| Sample 3 | 4.69 | 1.9E−4 | 24568.0 | 99.99% |
| Sample 4 | 2.70 | 8.9E−4 | 3044.2 | 99.96% |
| Sample 5 | 2.27 | 0.001 | 1822.5 | 99.96% |

In table 3, samples 1-5 represent the products for $SeO_2$ in an amount of 0.2 mmol, 0.4 mmol, 0.6 mmol, 0.8 mmol and 1.0 mmol respectively.

It can be seen from the results of embodiments 1-3 that binary lanthanide-actinide and thorium can be separated by the fractional crystallization method, and the separation ratio in a first separation can reach about 200,000, 170,000 and 90,000 respectively.

Embodiment 4

Separation of Ternary Lanthanide and Actinide Elements

In this example, crystals of rare earth elements (Th$(NO_3)_4 \cdot 6H_2O$, $Ce(NO_3)_3 \cdot 6H_2O$, and $La(NO_3)_3 \cdot 6H_2O$) were substituted for a rare earth mineral, to verify the effect of a method for removing radioactive element thorium in a rare earth mineral of the present invention.

0.05 mmol Th$(NO_3)_4 \cdot 6H_2O$ solid, 0.05 mmol Ce$(NO_3)_3 \cdot 6H_2O$ solid, 0.1 mmol La$(NO_3)_3 \cdot 6H_2O$ and $SeO_2$ were placed in a 10 mL polytetrafluoroethylene reaction vessel in a molar ratio of 1:1:2:4, 1:1:2:8, 1:1:2:12, 1:1:2:16 and 1:1:2:20 respectively, and 2 mL deionized water was added. The resulting mixture was sealed, heated up to a temperature of 230° C., heated for 3 days, and then cooled at a rate of 8.3° C./h to room temperature (20-30° C.) to give a crystal product. The crystal product was washed with deionized water and a washing solution was collected in a 10 mL centrifuge tube and diluted to volume. The resulting crystal product was washed with ethanol and 5-10% dilute nitric acid, and then allowed to dry at room temperature.

Figure 5:
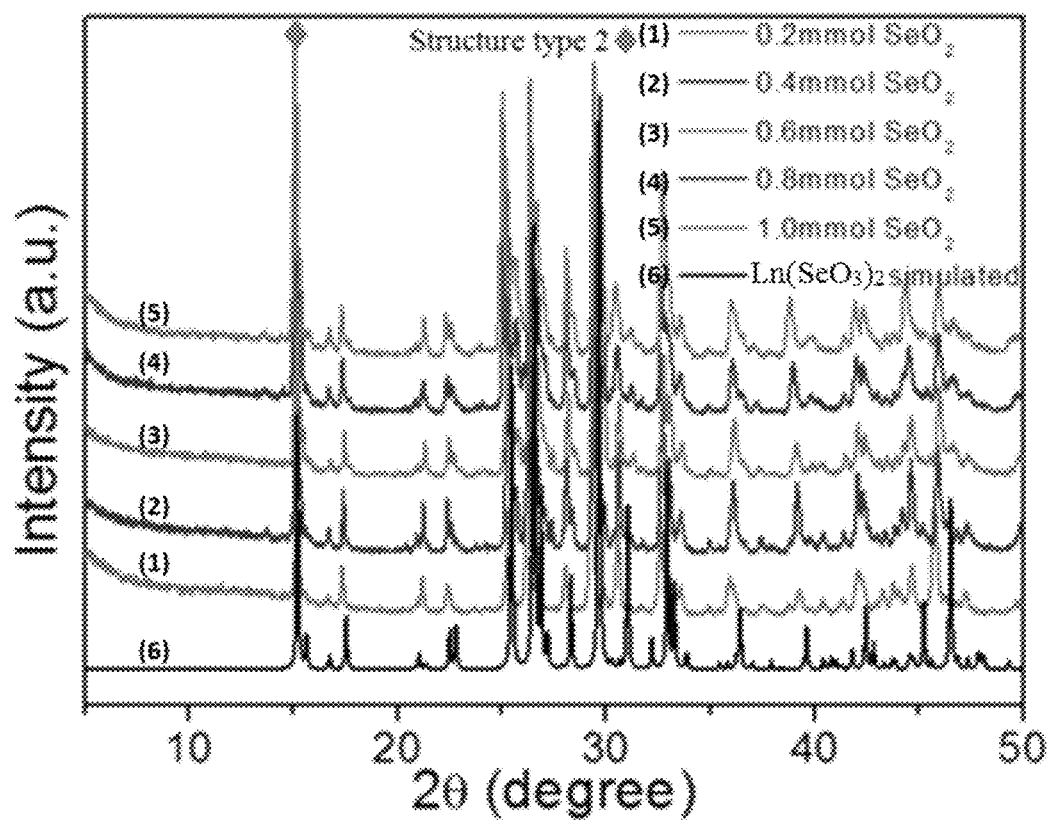
FIG. 5 is a powder diffraction pattern of the resulting crystals according to embodiment 4 of the present invention.

The generated crystals were characterized by a powder diffractometer, as shown in FIG. 5. It is shown from FIG. 5 that the doping reaction generates only one structure type of crystals. The crystals have the same structure as that of $Ce(SeO_3)_2$ crystal. The crystal was dissolved in concentrated nitric acid and then diluted to a low acid concentration. The concentration of each element was determined by ICP-Ms and ICP-OES. The concentration of each element in the washing solution was similarly determined by ICP-Ms and ICP-OES, and then a separation factor and a yield were calculated. The results are shown in Table 4.

TABLE 4

Separation factor and yield

| Molar ratio | Crystal $R_{Th(Ce)/La}$ | Washing solution $R_{Th(Ce)/La}$ | Separation factor | Recovery rate (Th) |
|---|---|---|---|---|
| Sample 1 | 34.1 | 0.292 | 173.4 | 99.87% |
| Sample 2 | 29.0 | 0.066 | 592.4 | 99.99% |
| Sample 3 | 21.5 | 0.028 | 1034.6 | 99.99% |
| Sample 4 | 16.1 | 0.021 | 1007.6 | 99.97% |
| Sample 5 | 15.9 | 0.006 | 3163.1 | 99.94% |

In table 4, samples 1-5 represent the products after the reaction of Th$(NO_3)_4 \cdot 6H_2O$ solid, Ce$(NO_3)_3 \cdot 6H_2O$ solid, La$(NO_3)_3 \cdot 6H_2O$, and $SeO_2$ in a molar ratio of 1:1:2:4, 1:1:2:8, 1:1:2:12, 1:1:2:16 and 1:1:2:20 respectively.

Embodiment 5

Separation of Ternary Lanthanide and Actinide Elements

In this example, crystals of rare earth elements (Th$(NO_3)_4 \cdot 6H_2O$, $Ce(NO_3)_3 \cdot 6H_2O$, and $Eu(NO_3)_3 \cdot 6H_2O$) were substituted for a rare earth mineral, to verify the effect of a method for removing radioactive element thorium in a rare earth mineral of the present invention.

0.05 mmol Th$(NO_3)_4 \cdot 6H_2O$ solid, 0.05 mmol Ce$(NO_3)_3 \cdot 6H_2O$ solid, 0.1 mmol Eu$(NO_3)_3 \cdot 6H_2O$, and $SeO_2$ were placed in a 10 mL polytetrafluoroethylene reaction vessel in a molar ratio of 1:1:2:4, 1:1:2:8, 1:1:2:12, 1:1:2:16 and 1:1:2:20 respectively, and 2 mL deionized water was added. The resulting mixture was sealed, heated up to a temperature of 230° C., heated for 3 days, and then cooled at a rate of 8.3° C./h to room temperature (20-30° C.) to give a crystal product. The crystal product was washed with deionized water and a washing solution was collected in a 10 mL centrifuge tube and diluted to volume. The resulting crystal product was washed with ethanol and 5-10% dilute nitric acid, and then allowed to dry at room temperature.

Figure 6:
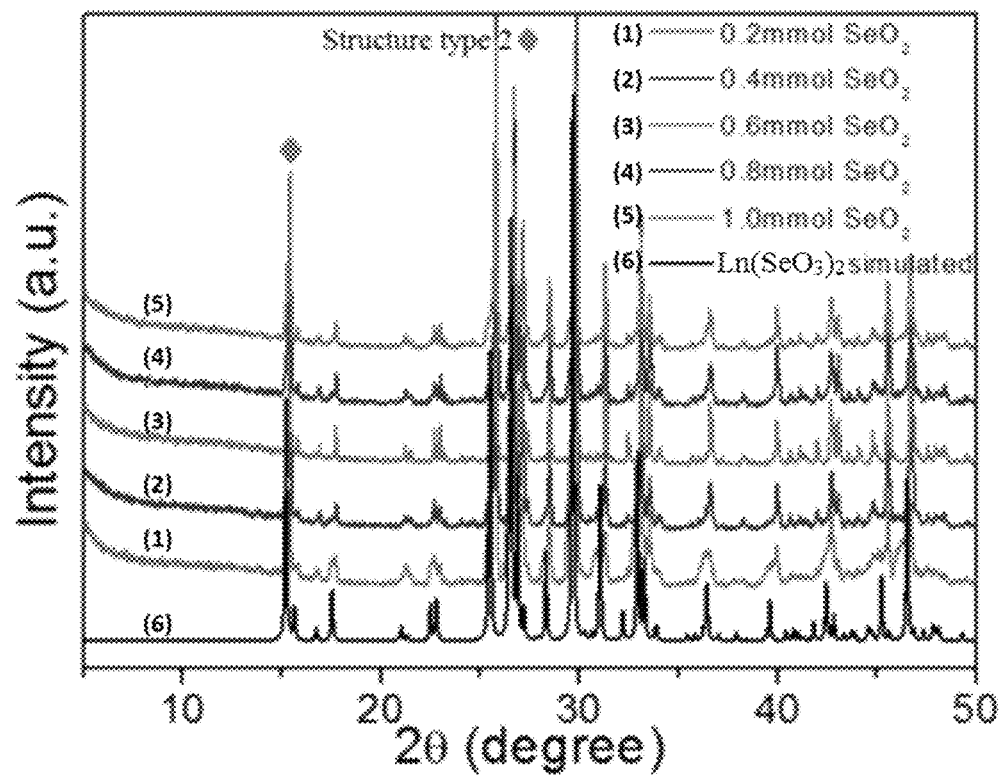
FIG. 6 is a powder diffraction pattern of the resulting crystals according to embodiment 5 of the present invention.

The generated crystals were characterized by a powder diffractometer, as shown in FIG. 6. It is shown from FIG. 6 that the doping reaction generates only one structure type of crystals. The crystals have the same structure as that of $Ce(SeO_3)_2$ crystal. The crystal was dissolved in concentrated nitric acid and then diluted to a low acid concentration. The concentration of each element was determined by ICP-Ms and ICP-OES. The concentration of each element in the washing solution was similarly determined by ICP-Ms and ICP-OES, and then a separation factor and a yield were calculated. The results are shown in Table 5.

TABLE 5

Separation factor and yield

| Molar ratio | Crystal $R_{Th(Ce)/Eu}$ | Washing solution $R_{Th(Ce)/Eu}$ | Separation factor | Recovery rate (Th) |
|---|---|---|---|---|
| Sample 1 | 20.8 | 0.430 | 74.7 | 99.81% |
| Sample 2 | 16.7 | 0.175 | 133.0 | 99.91% |
| Sample 3 | 12.9 | 0.091 | 192.2 | 99.91% |
| Sample 4 | 12.5 | 0.032 | 485.0 | 99.92% |
| Sample 5 | 11.4 | 0.007 | 2154.4 | 99.95% |

In table 5, samples 1-5 represent the products after the reaction of $Th(NO_3)_4 \cdot 6H_2O$ solid, $Ce(NO_3)_3 \cdot 6H_2O$ solid, $Eu(NO_3)_3 \cdot 6H_2O$, and $SeO_2$ in a molar ratio of 1:1:2:4, 1:1:2:8, 1:1:2:12, 1:1:2:16 and 1:1:2:20 respectively.

Embodiment 6

Separation of Ternary Lanthanide and Actinide Elements

In this example, crystals of rare earth elements (Th $(NO_3)_4 \cdot 6H_2O$, $Ce(NO_3)_3 \cdot 6H_2O$, and $Yb(NO_3)_3 \cdot 6H_2O$) were substituted for a rare earth mineral, to verify the effect of a method for removing radioactive element thorium in a rare earth mineral of the present invention.

0.05 mmol $Th(NO_3)_4 \cdot 6H_2O$ solid, 0.05 mmol $Ce(NO_3)_3 \cdot 6H_2O$ solid, 0.1 mmol $Yb(NO_3)_3 \cdot 6H_2O$, and $SeO_2$ were placed in a 10 mL polytetrafluoroethylene reaction vessel in a molar ratio of 1:1:2:4, 1:1:2:8, 1:1:2:12, 1:1:2:16 and 1:1:2:20 respectively, and 2 mL deionized water was added. The resulting mixture was sealed, heated up to a temperature of 230° C. and heated for 3 days, and then cooled at a rate of 8.3° C./h to room temperature (20-30° C.) to give a crystal product. The crystal product was washed with deionized water and a washing solution was collected in a 10 mL centrifuge tube and diluted to volume. The resulting crystal product was washed with ethanol and 5-10% dilute nitric acid, and then allowed to dry at room temperature.

Figure 7:
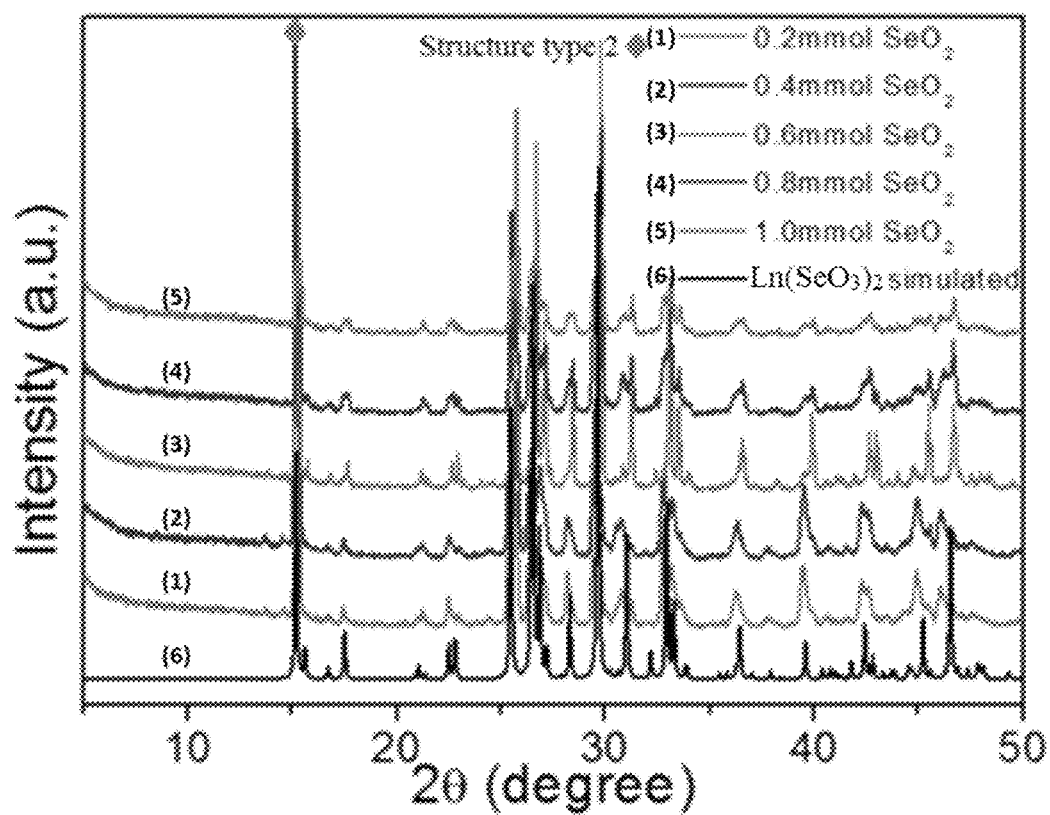
FIG. 7 is a powder diffraction pattern of the resulting crystals according to embodiment 6 of the present invention.

The generated crystals were characterized by a powder diffractometer, as shown in FIG. 7. It is shown from FIG. 7 that the doping reaction generates only one structure type of crystals. The crystals have the same structure as that of $Ce(SeO_3)_2$ crystal. The crystal was dissolved in concentrated nitric acid and then diluted to a low acid concentration. The concentration of each element was determined by ICP-Ms and ICP-OES. The concentration of each element in the washing solution was similarly determined by ICP-Ms and ICP-OES, and then a separation factor and a yield were calculated. The results are shown in Table 6.

TABLE 6

Separation factor and yield

| Molar ratio | Crystal $R_{Th(Ce)/Yb}$ | Washing solution $R_{Th(Ce)/Yb}$ | Separation factor | Recovery rate (Th) |
|---|---|---|---|---|
| Sample 1 | 35.3 | 0.392 | 138.6 | ~100% |
| Sample 2 | 23.8 | 0.157 | 209.1 | ~100% |
| Sample 3 | 16.3 | 0.077 | 285.2 | 99.99% |
| Sample 4 | 13.4 | 0.026 | 670.6 | 99.91% |
| Sample 5 | 13.2 | 0.006 | 2779.63 | 99.97% |

In table 6, samples 1-5 represent the products after the reaction of $Th(NO_3)_4 \cdot 6H_2O$ solid, $Ce(NO_3)_3 \cdot 6H_2O$ solid, $Yb(NO_3)_3 \cdot 6H_2O$ and $SeO_2$ in a molar ratio of 1:1:2:4, 1:1:2:8, 1:1:2:12, 1:1:2:16 and 1:1:2:20 respectively.

Example 7

Separation of Multiple Lanthanide and Actinide Elements

In this example, a rare earth ore, monazite, was simulated with crystals of multiple rare earth elements, to verify the effect of a method for removing radioactive element thorium in a rare earth mineral of the present invention.

0.2 mmol of a mixture of $Ln(NO_3)_3 \cdot 6H_2O$ (Ln=La, Ce, Pr, Nd, Sm, Eu, Gd, Dy, Er, Yb, Y) and $Th(NO_3)_4 \cdot 6H_2O$ (in the mixture: about 20% La element, 43% Ce element, 4.5% Pr element, 16% Nd element, 3% Sm element, 0.1% Eu element, 1.5% Gd element, 0.6% Dy element, 0.2% Er element, 0.1% Yb element, 2.5% Y element, and 8~10% Th element) and $SeO_2$ were placed in a 10 mL polytetrafluoroethylene reaction vessel in a ratio of 1:1, 1:2, 1:3, 1:4 and 1:5 respectively, and 2 mL deionized water was added. The resulting mixture was sealed, heated up to a temperature of 230° C. and heated for 3 days, and then cooled at a rate of 8.3° C./h to room temperature. The crystal product was washed with deionized water and a washing solution was collected in a 10 mL centrifuge tube and diluted to volume. The resulting crystal product was washed with ethanol and 5-10% dilute nitric acid, and then allowed to dry at room temperature.

Figure 8:
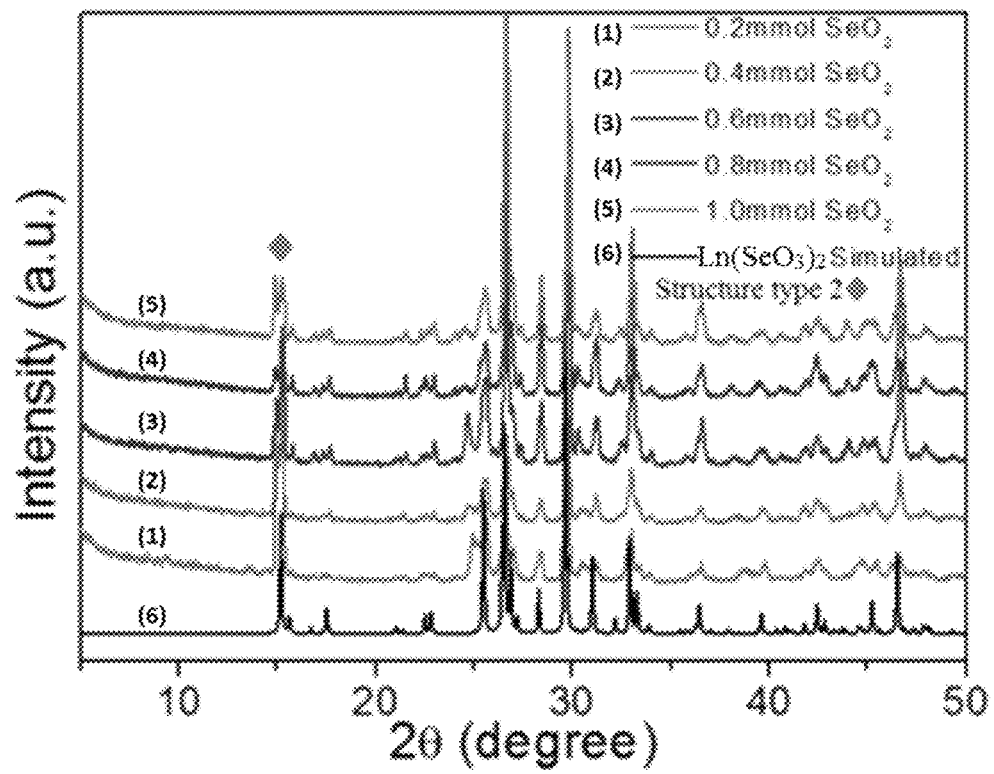
FIG. 8 is a powder diffraction pattern of the resulting crystals according to embodiment 7 of the present invention.
Figure 9:
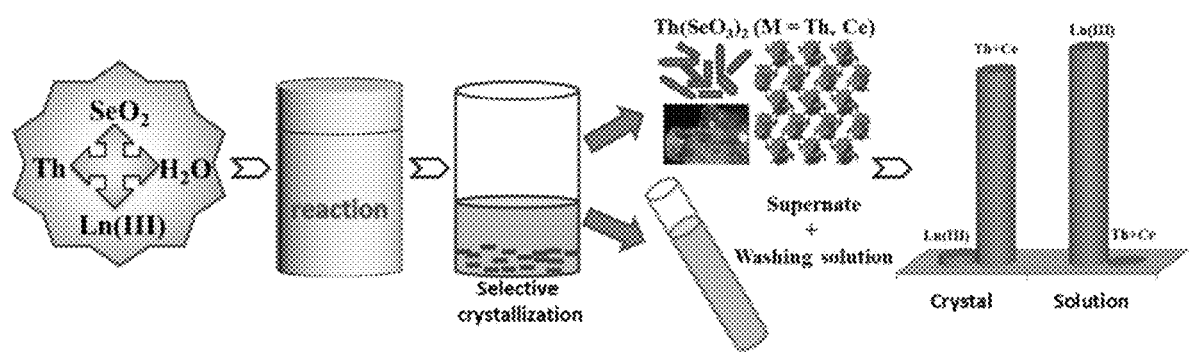
FIG. 9 is a schematic diagram of the separation principle of the present invention.

The generated crystals were characterized by a powder diffractometer, as shown in FIG. 8. It is shown from FIG. 8 that the doping reaction generates only one structure type of crystals. The crystals have the same structure as that of $Ce(SeO_3)_2$ crystal. The crystal was dissolved in concentrated nitric acid and then diluted to a low acid concentration. The concentration of each element was determined by ICP-Ms and ICP-OES. The concentration of each element in the washing solution was similarly determined by ICP-Ms and ICP-OES, and then a separation factor and a yield were calculated. The results are shown in Table 7.

TABLE 7

Separation factor and yield

| Molar ratio | Crystal $R_{Th(Ce)/Ln}$ | Washing solution $R_{Th(Ce)/Ln}$ | Separation factor | Recovery rate (Th) |
|---|---|---|---|---|
| Sample 1 | 13.8 | 0.420 | 32.9 | 99.93% |
| Sample 2 | 11.1 | 0.133 | 83.5 | 99.98% |
| Sample 3 | 7.24 | 0.016 | 462.7 | 99.99% |
| Sample 4 | 7.19 | 0.005 | 1541.3 | 99.98% |
| Sample 5 | 6.34 | 0.003 | 1996.5 | 99.99% |

In table 7, samples 1-5 represents the products after the reaction of the mixture and $SeO_2$ in a molar ratio of 1:1, 1:2, 1:3, 1:4 and 1:5 respectively.

The results of embodiments 4-7 indicate that the separation ratio of trivalent elements and tetravalent elements can reach about 1800 in the separation system of ternary and multi-component lanthanide and actinide elements.

The above description is only preferred embodiments of the present invention and not intended to limit the present invention, it should be noted that those of ordinary skill in the art can further make various modifications and variations without departing from the technical principles of the present invention, and these modifications and variations also should be considered to be within the scope of protection of the present invention.

What is claimed is:

1. A method for removing radioactive element thorium in monazite, comprising steps of:
   mixing the monazite with selenium dioxide in water,
   reacting the radioactive element thorium in the monazite with selenium dioxide by a hydrothermal method,
   cooling a resulting solution to form a crystal, and
   separating the crystal to remove the radioactive element thorium.

2. The method as claimed in claim 1, wherein the hydrothermal method includes performing the reaction at 200-230° C. for 1-3 days.

3. The method as claimed in claim 1, wherein the resulting solution is cooled to room temperature after the reaction is completed.

4. The method as claimed in claim 2, wherein the cooling rate is 4-10° C./h.

5. The method as claimed in claim 1, further comprising a step of washing the crystal after separating the crystal.

6. The method as claimed in claim 5, wherein the crystal is washed with water, alcohol and dilute nitric acid.

7. The method as claimed in claim 6, wherein the dilute nitric acid has a mass concentration of 5-10%.

8. The method as claimed in claim 1, wherein the crystal is a needle-like and flocculent crystal.

* * * * *